United States Patent
Gorecki et al.

(10) Patent No.: US 9,473,090 B2
(45) Date of Patent: Oct. 18, 2016

(54) TRANS-IMPEDANCE AMPLIFIER WITH REPLICA GAIN CONTROL

(71) Applicant: INPHI CORPORATION, Santa Clara, CA (US)

(72) Inventors: James Lawrence Gorecki, Santa Clara, CA (US); Irene Quek, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 35 days.

(21) Appl. No.: 14/550,842

(22) Filed: Nov. 21, 2014

(65) Prior Publication Data

US 2016/0149548 A1   May 26, 2016

(51) Int. Cl.
| | |
|---|---|
| H03F 3/08 | (2006.01) |
| H03F 3/45 | (2006.01) |
| H03G 3/30 | (2006.01) |
| H03G 1/00 | (2006.01) |
| H03F 1/08 | (2006.01) |
| H03F 3/30 | (2006.01) |

(52) U.S. Cl.
CPC .......... *H03F 3/45076* (2013.01); *H03F 1/086* (2013.01); *H03F 3/082* (2013.01); *H03F 3/3028* (2013.01); *H03F 3/45179* (2013.01); *H03G 1/0035* (2013.01); *H03G 3/3084* (2013.01); *H03F 2200/453* (2013.01); *H03F 2203/30084* (2013.01); *H03F 2203/30117* (2013.01); *H03F 2203/45224* (2013.01); *H03F 2203/45288* (2013.01)

(58) Field of Classification Search
CPC ....................................................... H03F 3/08
USPC ............................................. 330/308, 59, 110
See application file for complete search history.

(56) References Cited

U.S. PATENT DOCUMENTS

| | | |
|---|---|---|
| 5,592,612 A | 1/1997 | Birk |
| 6,128,094 A | 10/2000 | Smith |
| 6,275,541 B1 * | 8/2001 | Nagahori ............. H04L 25/061 375/318 |
| 6,400,621 B2 | 6/2002 | Hidaka et al. |
| 6,542,956 B1 | 4/2003 | Lee et al. |
| 6,993,701 B2 | 1/2006 | Corbett et al. |
| 7,656,727 B2 | 2/2010 | Thayer |
| 7,990,746 B2 | 8/2011 | Rajan |
| 8,325,554 B2 | 12/2012 | Sweere et al. |
| 8,687,451 B2 | 4/2014 | Wang |

(Continued)

OTHER PUBLICATIONS

Office Action for U.S. Appl. No. 13/653,373, dated Mar. 27, 2014.

(Continued)

*Primary Examiner* — Khanh V Nguyen
*Assistant Examiner* — Khiem Nguyen
(74) *Attorney, Agent, or Firm* — Richard T. Ogawa; Ogawa P.C.

(57) ABSTRACT

This disclosure relates to the field of amplifiers for multi-level optical communication and more particularly to techniques for trans-impedance amplifiers (TIA) with gain control. The claimed embodiments address the problem of implementing a low cost TIA that exhibits high linearity, low noise, low power, and wide bandwidth. More specifically, some claims are directed to approaches for providing TIA gain control using a plurality of inverter-based replica gain control cells controlled by a feedback loop to manage the current into the amplifying output stage and thereby the TIA output voltage.

20 Claims, 12 Drawing Sheets

(56) References Cited

U.S. PATENT DOCUMENTS

| | | |
|---|---|---|
| 2004/0123029 A1 | 6/2004 | Dalal et al. |
| 2006/0200697 A1 | 9/2006 | Ito |
| 2008/0104290 A1 | 5/2008 | Cowell et al. |
| 2008/0183959 A1 | 7/2008 | Pelley et al. |
| 2009/0141558 A1 | 6/2009 | Sarin et al. |
| 2009/0300259 A1 | 12/2009 | Luo et al. |
| 2010/0005212 A1 | 1/2010 | Gower et al. |
| 2010/0162037 A1 | 6/2010 | Maule et al. |
| 2010/0199125 A1 | 8/2010 | Reche |
| 2010/0274952 A1 | 10/2010 | Lee |
| 2011/0072200 A1 | 3/2011 | Lee et al. |
| 2011/0125990 A1 | 5/2011 | Khosravi et al. |
| 2011/0170329 A1 | 7/2011 | Kang |
| 2012/0151294 A1 | 6/2012 | Yoo et al. |
| 2012/0243299 A1 | 9/2012 | Shau |
| 2012/0257459 A1 | 10/2012 | Berke |
| 2012/0297231 A1 | 11/2012 | Qawami et al. |
| 2013/0060996 A1 | 3/2013 | Berke |

OTHER PUBLICATIONS

Notice of Allowance for U.S. Appl. No. 13/558,332, dated Feb. 25, 2014.
Office Action for U.S. Appl. No. 13/620,288, dated Oct. 1, 2013.
Office Action for U.S. Appl. No. 13/791,814, dated May 1, 2014.
Office Action for U.S. Appl. No. 13/619,692, dated May 14, 2014.
Office Action for U.S. Appl. No. 13/620,288, dated May 16, 2014.
Office Action for U.S. Appl. No. 13/791,807, dated May 29, 2014.
Office Action for U.S. Appl. No. 14/178,241, dated Jun. 27, 2014.

* cited by examiner

US 9,473,090 B2

TRANS-IMPEDANCE AMPLIFIER WITH REPLICA GAIN CONTROL

RELATED APPLICATIONS

N/A.

FIELD

This disclosure relates to the field of amplifiers for multi-level optical communication and more particularly to techniques for trans-impedance amplifiers with gain control.

BACKGROUND

The trans-impedance amplifier or TIA is a key component in high-speed communication (e.g., fiber optic) networks and systems. For example, in a fiber optic system, a TIA will convert a signal current from a photodiode into an output voltage. The photodiode signal current varies with both the incident light (e.g., from the fiber optic link) and aging of the system (e.g., of the photodiode, of the driving laser, etc.). Specifically, photodiode AC signal currents can vary from 20 $\mu A_{p-p}$ to over 3 $mA_{p-p}$, a range of 150 times or approximately 43 dB, while the TIA output voltage can be required to maintain a fixed level of a few hundred mV peak-to-peak.

Legacy TIA designs were implemented in communication systems deploying non-return-to-zero or NRZ (e.g., two-level) signaling. In these systems, the TIA can be followed by a limiting amplifier to control output variations, since the bit-error-rate or BER requirements are not impacted by the reduced linearity. However, to accommodate the continual demand for more data bandwidth over such networks and systems, multi-level signaling (e.g., pulse-amplitude modulation or PAM) has been deployed. For example, PAM-16 signaling or modulation refers to 16-level signaling as compared to two-level signaling of NRZ. The use of multi-level signaling in turn demands higher performance from the TIAs in the system. Specifically, the TIA needs to accurately reproduce the multiple levels of the signal with low distortion for the subsequent signal processing stages (e.g., continuous-time linear equalizer, analog-to-digital converter, digital signal processing, etc.).

Systems with multi-level signaling can also require a TIA to have high linearity (e.g., 6 bits to 8 bits), which translates to low total harmonic distortion or THD (e.g., −37 dB to −48 dB, respectively). The optical links can further operate at high data rates (e.g., 28 Gbps to 100 Gbps) and require wide frequency response bandwidths (e.g., 6 GHz to 35 GHz). Additionally, the small input current signal levels can require very low noise levels (e.g., less than 1 $\mu A_{rms}$ referred to the photodiode current). Legacy TIA designs using a cost-effective semiconductor manufacturing process and material (e.g., Si CMOS) have higher distortion (e.g., −34 dB) and higher noise levels (e.g., greater than 3 $\mu A_{rms}$) than required by multi-level signaling systems. Other legacy TIA designs can exhibit improved performance, but at the cost of requiring a specialized semiconductor manufacturing process and material (e.g., SiGe bipolar).

Techniques are needed address the problem of implementing a low cost TIA that exhibits high linearity, low noise, low power, and wide bandwidth. Specifically, none of the aforementioned legacy approaches achieve the capabilities of the herein-disclosed trans-impedance amplifier with replica gain control, therefore, there is a need for improvements.

SUMMARY

The present disclosure provides an improved systems and methods suited to address the aforementioned issues with legacy approaches. More specifically, the present disclosure provides a detailed description of techniques used in systems and methods for trans-impedance amplifiers with replica gain control. The claimed embodiments address the problem of implementing a low cost TIA that exhibits high linearity, low noise, low power, and wide bandwidth. More specifically, some claims are directed to approaches for providing TIA gain control using a plurality of inverter-based replica gain control cells controlled by a feedback loop to manage the current into the amplifying output stage and thereby the TIA output voltage. Such implementations and claims thereto advance the technical fields for addressing the problem of implementing a low cost TIA that exhibits high linearity, low noise, low power, and wide bandwidth, as well as advancing peripheral technical fields.

Some embodiments of the present disclosure are directed to a trans-impedance amplifier having an inverting amplifier and a replica gain control module coupled to a common current input node, wherein the replica gain control module comprises one or more inverter-based replica gain control cells that can each be controlled (e.g., enabled, disabled, biased, etc.) such that a controlled portion of the current input can be steered away from the inverting amplifier input to control the output voltage of the inverting amplifier. In certain embodiments, a gain control loop can be connected between the TIA output and the replica gain control module to provide control of the module to accommodate varying current input signals. In certain embodiments, two sets of inverting amplifiers and replica gain control modules can be implemented in a system and share a common current source (e.g., photodiode current) to provide a differential output voltage.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings, described below, are for illustration purposes only. The drawings are not intended to limit the scope of the present disclosure.

DETAILED DESCRIPTION

Overview

Figure 1:
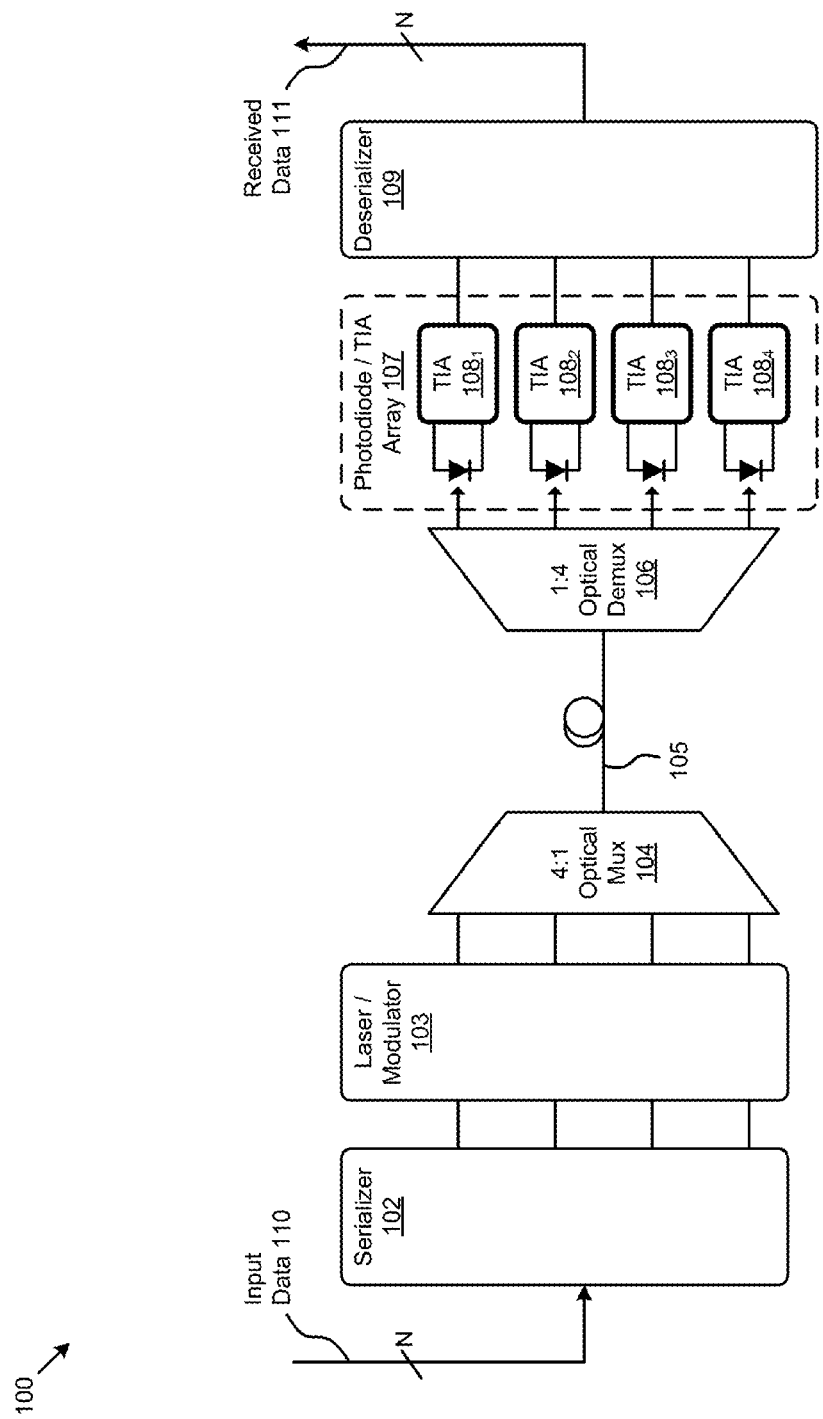
FIG. 1 illustrates a fiber optic communication system in an environment that includes trans-impedance amplifiers.

The trans-impedance amplifier or TIA is a key component in high-speed communication (e.g., fiber optic) networks and systems. To accommodate the continual demand for more data bandwidth over such networks and systems, multi-level signaling (e.g., pulse-amplitude modulation or PAM) has been deployed. The use of multi-level signaling in turn demands higher performance from the TIAs in the system. Specifically, the TIA needs to accurately reproduce the multiple levels of the signal with low distortion (e.g., high linearity), low noise, and wide bandwidth, while leveraging power-efficient and cost-effective semiconductor manufacturing processes and materials (e.g., Si CMOS).

Some embodiments of the present disclosure address the problem of implementing a low cost CMOS TIA that exhibits high linearity, low noise, low power, and wide bandwidth and some embodiments are directed to approaches for providing TIA gain control using a plurality of inverter-based replica gain control cells controlled by a feedback loop to manage the current into the amplifying output stage and thereby the TIA output voltage. More particularly, disclosed herein and in the accompanying figures are exemplary environments, methods, and systems for trans-impedance amplifiers with replica gain control.

Some embodiments of the present disclosure are directed to a trans-impedance amplifier having an inverting amplifier and a replica gain control module coupled to a common current input node, wherein the replica gain control module comprises one or more inverter-based replica gain control cells that can each be controlled (e.g., enabled, disabled, biased, etc.) such that a controlled portion of the current input can be steered away from the inverting amplifier and the voltage output of the amplifier can be controlled. In certain embodiments, a gain control loop can be connected between the TIA output and the replica gain control module to provide control of the module. In certain embodiments, two sets of inverting amplifiers and replica gain control modules can be implemented in a system and share a common current source (e.g., photodiode current) to provide a differential output voltage.

DEFINITIONS

Some of the terms used in this description are defined below for easy reference. The presented terms and their respective definitions are not rigidly restricted to these definitions—a term may be further defined by the term's use within this disclosure.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

Descriptions of Exemplary Embodiments

FIG. 1 illustrates a fiber optic communication system 100 in an environment that includes trans-impedance amplifiers. As an option, one or more instances of fiber optic communication system 100 or any aspect thereof may be implemented in the context of the architecture and functionality of the embodiments described herein. Also, fiber optic communication system 100 or any aspect thereof may be implemented in any desired environment.

As shown in FIG. 1, fiber optic communication system 100 illustrates the key components of a fiber optic communications system including one or more TIAs. For example, fiber optic communication system 100 can represent a 100 GbE-LR4 system. Fiber optic communication system 100 can also be representative of similar systems in a variety of environments and applications, such as non-optical serial data communication links and memory data interfaces. Specifically, fiber optic communication system 100 comprises a serializer 102, a laser and modulator 103, a 4:1 optical mux 104, a fiber optic link 105, a 1:4 optical demux 106, a photodiode and TIA array 107, and a deserializer 109. Photodiode and TIA array 107 further comprises a plurality of TIAs 108 (e.g., TIA 108$_1$, TIA 108$_2$, TIA 108$_3$, and TIA 108$_4$) each with an associated photodiode as illustrated in FIG. 1. In other systems, any number of TIAs can be used. Fiber optic communication system 100 illustrates that parallel (e.g., N wide) input data 110 is received by serializer 102 and converted to a serial data stream having four channels (e.g., for LR4). The serial data is then received by laser and modulator 103 to be converted to modulated (e.g., PAM-xx, QPSK, etc.) optical signals. The four channels are multiplexed into one channel by 4:1 optical mux 104 and delivered to optical link 105. The optical signal is received by 1:4 optical demux 106 and demultiplexed to four channels and delivered to photodiode and TIA array 107. The plurality of TIAs 108 convert the current signals (e.g., through the photodiodes) to voltage signals to be received by deserializer 109. Deserializer 109 then converts the four channels of serial data to parallel (e.g., N wide) received data 111.

The plurality of TIAs 108 are a critical component of fiber optic communication system 100 in that they enable an accurate (e.g., low BER) recovery of the information contained within input data 110. The plurality of TIAs 108 accomplishes this, in part, by converting the optical representation of input data 110 into the voltage representation of input data 110. As more sophisticated signal modulation and longer links are deployed, techniques are needed meet these requirements by implementing a low cost TIA that exhibits high linearity, low noise, low power, and wide bandwidth.

Figure 2:
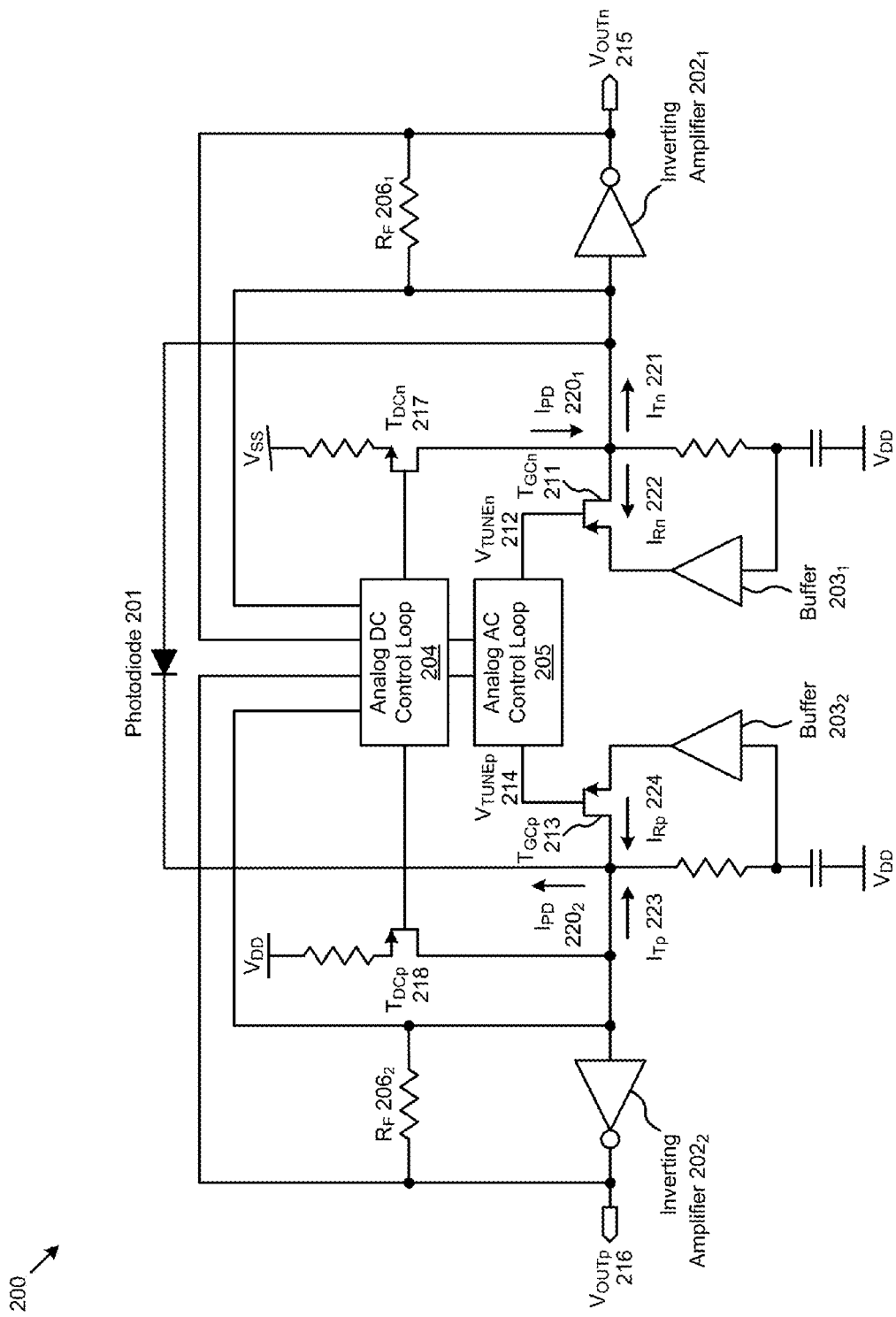
FIG. 2 is a schematic of a full differential trans-impedance amplifier with resistive gain control.

FIG. 2 is a schematic 200 of a full differential trans-impedance amplifier with resistive gain control. As an option, one or more instances of schematic 200 or any aspect thereof may be implemented in the context of the architecture and functionality of the embodiments described herein. Also, schematic 200 or any aspect thereof may be implemented in any desired environment.

As shown in FIG. 2, schematic 200 comprises a photodiode 201, a first inverting amplifier $202_1$, a second inverting amplifier $202_2$, a first buffer $203_1$, a second buffer $203_2$, an analog DC control loop 204, and an analog AC control loop 205. A first feedback resistor $R_F$ $206_1$ is connected between the input and output of first inverting amplifier $202_1$, and a second feedback resistor $R_F$ $206_2$ is connected between the input and output of second inverting amplifier $202_2$. For illustrative purposes, the value of first feedback resistor $R_F$ $206_1$ and the value of second feedback resistor $R_F$ $206_2$ can be represented by "R1" and "R2", respectively, and the gain of first inverting amplifier $202_1$ and the gain of second inverting amplifier $202_2$ can be represented by "G1" and "G2", respectively. In some embodiments, schematic 200 can represent a CMOS implementation of a SiGe (e.g., bipolar) design. In such implementations, the use of CMOS inverters as first inverting amplifier $202_1$ and second inverting amplifier $202_2$ can simplify implementation, provide low noise, and allow operation at low voltages (e.g., less than 1V). As shown in schematic 200, a first current $I_{PD}$ $220_1$ flowing from the anode of photodiode 201 is steered either to a current $I_{Tn}$ 221 toward first inverting amplifier $202_1$, or to a current $I_{Rn}$ 222 toward first buffer $203_1$ through a transistor $T_{CGn}$ 211 (e.g., MOS device), wherein an analog tuning voltage $V_{tuNen}$ 212 at the gate of transistor $T_{GCn}$ 211 can adjust the amount of current $I_{PD}$ $220_1$ that is steered to current $I_{Tn}$ 221 and to current $I_{Rn}$ 222. Similarly, a second current $I_{PD}$ $220_2$ (e.g., equal to first current $I_{PD}$ $220_1$) flowing into the cathode of photodiode 201 includes a current $I_{Tp}$ 223 from second inverting amplifier $202_2$, and a current $I_{Rp}$ 224 from second buffer $203_2$ through a transistor $T_{GCp}$ 213 (e.g., MOS device), wherein a second analog tuning voltage $V_{TUNEp}$ 214 at the gate of transistor $T_{GCp}$ 213 can tune the amount of current $I_{Rp}$ 224 (e.g., relative to current $I_{Tp}$ 223) included in current $I_{PD}$ $220_2$. The amount of tuning or steering provided, in part, by voltage $V_{TUNEn}$ 212 will be determined, in part, by the impedance looking into first inverting amplifier $202_1$ (e.g., equal to R1/(G1+1)) and the impedance looking into the drain of transistor $T_{GCn}$ 211, which is determined, in part, by the impedance of transistor $T_{GCn}$ 211 and the output impedance of first buffer $203_1$. Similarly, the amount of tuning or steering provided, in part, by voltage $V_{TUNEp}$ 214 will be determined, in part, by the impedance looking into second inverting amplifier $202_2$ (e.g., equal to R2/(G2+1)) and the impedance looking into the drain of transistor $T_{GCp}$ 213, which is determined, in part, by the impedance of transistor $T_{GCp}$ 213 and the output impedance of second buffer $203_2$. The analog tuning voltages can derive from a digital-to-analog convertor (DAC) of any type to produce an analog voltage.

In some embodiments, each of the plurality of buffers 203 is configured to be a unity gain buffer with very low output impedance. In certain embodiments, voltage $V_{TUNEn}$ 212 and voltage $V_{TUNEp}$ 214 are controlled by analog AC control loop 205 to produce a fixed peak-to-peak output voltage determined by the difference between a negative output voltage $V_{OUTn}$ 215 and a positive output voltage $V_{OUTp}$ 216, respectively. In some embodiments, analog AC control loop 205 can include an analog power rectifier and comparator, and an analog control loop. In certain embodiments, the bias or DC voltage at the input of first inverting amplifier $202_1$ is controlled, in part, by analog DC control loop 204 through a transistor $T_{DCn}$ 217 and first feedback resistor RF $206_1$, and the bias or DC voltage at the input of second inverting amplifier $202_2$ is controlled, in part, by analog DC control loop 204 through a transistor $T_{DCp}$ 218 and second feedback resistor RF $206_2$. Such control of the DC voltages at the input of first inverting amplifier $202_1$ and second inverting amplifier $202_2$ can serve to prevent unwanted DC currents that can increase power dissipation and degrade total harmonic distortion or THD.

In some embodiments, the desired operation and performance of the implementation shown in schematic 200 can require that both first buffer $203_1$ and second buffer $203_2$ have a very high bandwidth and very low output impedance (e.g., a few ohms at frequencies greater than 1 GHz). Such performance cannot be achieved using a cost-effective semiconductor manufacturing process (e.g., 28 nm CMOS) with either widely used device structures (e.g., planar FET) or specialized device structures (e.g., FinFET). This is due, in part, to differences in device transconductance or $g_m$ among various semiconductor manufacturing processes (e.g., CMOS FET $g_m$ is less than SiGe bipolar $g_m$). For example, transistor $T_{GCn}$ 211 and transistor $T_{GCp}$ 213 that are tuned by analog AC control loop 205 would need to range from a very small impedance (e.g., 2-3Ω) to a very large impedance (e.g., over 100 kΩ). If implemented in CMOS, the size of transistor $T_{GCn}$ 211 and transistor $T_{GCp}$ 213 required to meet these metrics would result in parasitic capacitances that would significantly limit the TIA bandwidth (e.g., when gain control is not needed). Further, high linearity is difficult to achieve using transistor $T_{GCn}$ 211 and transistor $T_{GCp}$ 213 in a series configuration as the characteristics of the devices will change as various device voltages (e.g., $V_{GS}$ and $V_{BS}$) change with first current $I_{PD}$ $220_1$ and second current $I_{PD}$ $220_2$, respectively. Further, in some embodiments, distortion can increase as more AC current is shunted away from first inverting amplifier $202_1$ and second inverting amplifier $202_2$, and into first buffer $203_1$ and second buffer $203_2$, respectively. Thus, there is a need for techniques to address the problem of implementing a low cost TIA that exhibits high linearity, low noise, low power, and wide bandwidth.

Figure 3A:
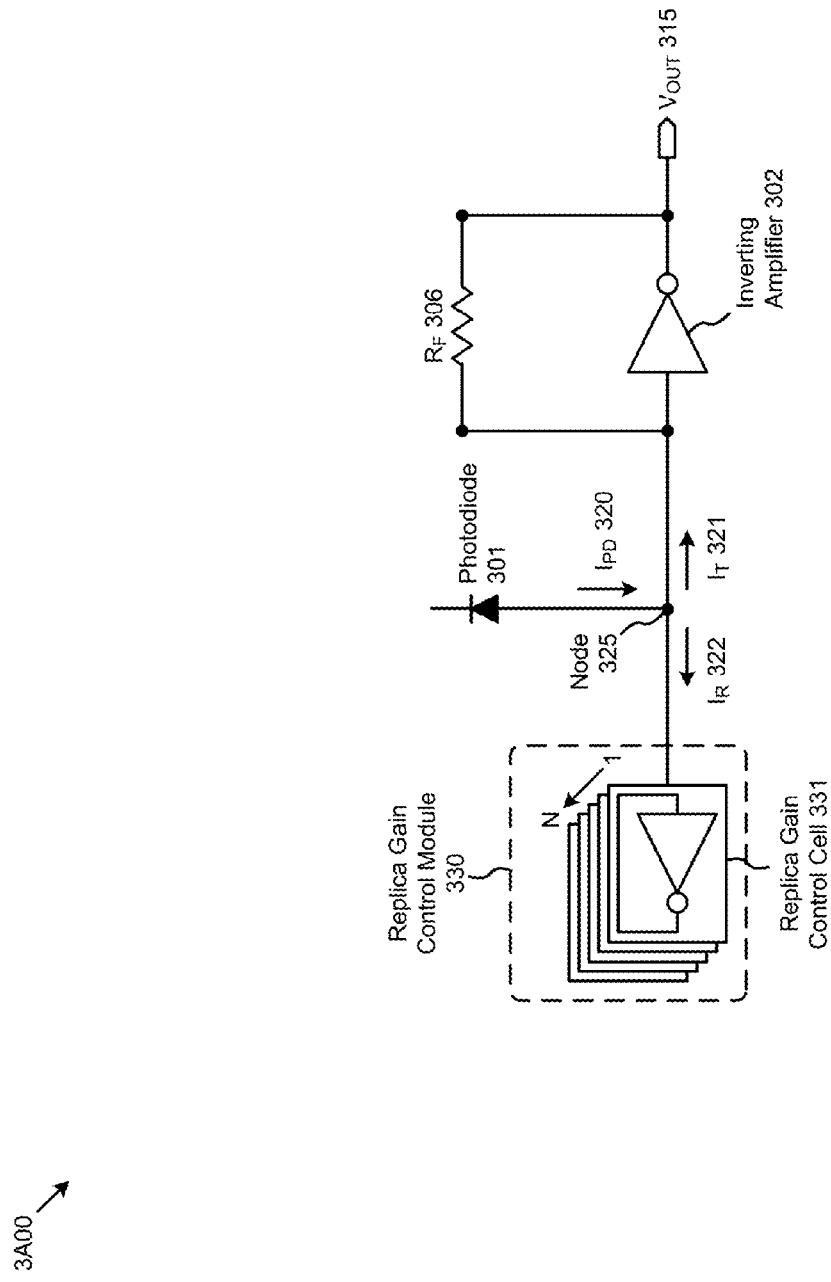
FIG. 3A is a diagram showing a replica gain control module as used to implement various trans-impedance amplifiers with replica gain control, according to some embodiments.

FIG. 3A is a diagram 3A00 showing a replica gain control module as used to implement various trans-impedance amplifiers with replica gain control. As an option, one or more instances of diagram 3A00 or any aspect thereof may be implemented in the context of the architecture and functionality of the embodiments described herein. Also, diagram 3A00 or any aspect thereof may be implemented in any desired environment.

As shown in FIG. 3A, diagram 3A00 comprises a photodiode 301, an inverting amplifier 302, a feedback resistor $R_F$ 306, and a replica gain control module 330. Replica gain control module 330 further comprises a plurality of instances (e.g., N instances) of a replica gain control cell 331. In some embodiments, the components and configuration shown in diagram 3A00 can be used in various implementations of trans-impedance amplifiers with replica gain control. As shown in diagram 3A00, replica gain control cell 331 is comprised, in part, of an inverter. The inverter of replica gain control cell 331 can exhibit very low noise referred to a current $I_{PD}$ 320 from photodiode 301. The plurality of instances of replica gain control cell 331 in replica gain control module 330 further create an effective impedance in parallel with the effective impedance of inverting amplifier 302 and feedback resistor $R_F$ 306 at a common node 325. The relative value of each of these effective impedances will determine the portion of current $I_{PD}$ 320 that is steered toward replica gain control module 330 as a current $I_R$ 322, and the portion of current $I_{PD}$ 320 that is steered toward inverting amplifier 302 as a current $I_T$ 321, where, $$I_{PD} = I_T + I_R \quad [\text{EQ. 1}]$$

Controlling current $I_T$ 321 and current $I_R$ 322 in turn controls an output voltage $V_{OUT}$ 315 of inverting amplifier 302 according to the approximate relationship below:

$$V_{OUT} \approx -I_T * R_F \quad [\text{EQ. 2}]$$

Output voltage $V_{OUT}$ 315 is then determined, in part, by the effective total impedance, $R_R$, of replica gain control module 330, which is determined, in part, by the input impedance, $R_{CELL}$, of each instance of replica gain control cell 331. The input impedance $R_{CELL}$ of each instance of replica gain control cell 331 is approximately $1/g_{mCELL}$, where $g_{mCELL}$ is the total equivalent transconductance of the transistors in each instance of replica gain control cell 331 as seen from node 325. The aggregate input impedance $R_R$ looking into replica gain control module 330 is then the parallel combination of the total $R_{CELL}$ of each of the plurality of instances (e.g., N instances) of replica gain control cell 331. For example, in some embodiments, replica gain control module 330 can comprise n total instances of replica gain control cell 331, wherein each instance of replica gain control cell 331 has an impedance of $R_{CELL}$, and the aggregate input impedance looking into replica gain control module 330 at node 325 is then $R_{CELL}/n$. When n is effectively zero (e.g., when no instances of replica gain control cell 331 are enabled), the DC input impedance looking into replica gain control module 330 is very high and no portion of current $I_{PD}$ 320 is shunted away from inverting amplifier 302 (e.g., $I_T = I_{PD}$).

In some embodiments, the implementation shown in diagram 3A00 can be configured to exhibit limited voltage excursions at node 325, resulting in a highly linear operation of each instance of replica gain control cell 331 and replica gain control module 330. In some embodiments, replica gain control module 330 can exhibit a higher linearity than inverting amplifier 302. When the voltage at node 325 is controlled (e.g., with a DC control loop) with limited additional distortion, a TIA that includes an embodiment of the replica gain control disclosed herein can operate with high linearity over a full range of photodiode signal currents (e.g., $I_{PD}$ 320).

Having separate instances of replica gain control cell 331 within replica gain control module 330 results in discrete steps in the input impedance of replica gain control module 330 depending on the number of instances of replica gain control cell 331 (e.g., N=n, N=m, etc.). Discrete steps in the input impedance of replica gain control module 330 also results in discrete steps in output voltage $V_{OUT}$ 315. In some embodiments, discrete steps are not allowed and a solution is required. One such solution (e.g., analog tuning to interpolate between discrete steps or settings) is described below in FIG. 3B and the associated disclosure.

Figure 3B:
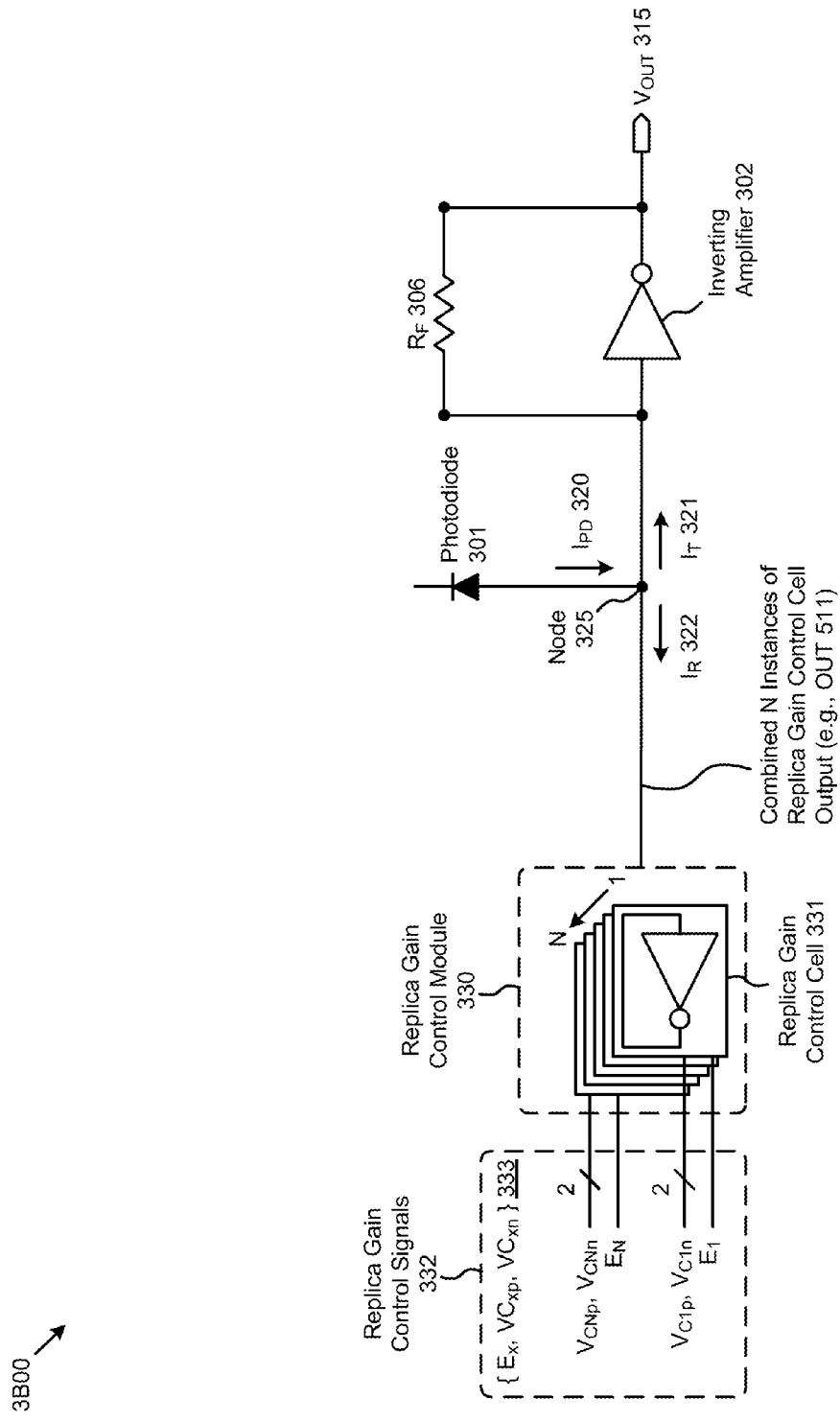
FIG. 3B is a diagram showing a replica gain control module with analog tuning as used to implement various trans-impedance amplifiers with replica gain control, according to some embodiments.

FIG. 3B is a diagram 3B00 showing a replica gain control module with analog tuning as used to implement various trans-impedance amplifiers with replica gain control. As an option, one or more instances of diagram 3B00 or any aspect thereof may be implemented in the context of the architecture and functionality of the embodiments described herein. Also, diagram 3B00 or any aspect thereof may be implemented in any desired environment.

As shown in FIG. 3B, diagram 3B00 comprises the components in diagram 3A00 and further comprises a set of replica gain control signals 332. Replica gain control signals 332 further comprises a set of cell control signals 333 (e.g., a digital cell enable signal $E_x$, and a differential pair of analog control voltages $V_{Cxp}$ and $V_{Cxn}$) for each instance (e.g., cell "x") of replica gain control cell 331. In some embodiments, signal $E_x$ can enable an individual cell (e.g., turn it on and off), and voltages $V_{Cxp}$ and $V_{Cxn}$ can vary the cell impedance $R_{CELL}$ (e.g., from infinity or open, to approximately $1/g_{mCELL}$). Given these characteristics, in some embodiments, the total impedance $R_R$ looking into replica gain control module 330 at node 325, with n of N total instances of replica gain control cell 331 enabled, is:

$$R_R = R_{CELL}/(n+\alpha_v-1) \quad [\text{EQ. 3}]$$

where, $$\alpha_v = V_{Cxp}/V_{DD},$$

$0 \leq \alpha_v \leq 1$ (linearly varying), and $1 \leq n \leq N$.

Also, as $V_{CxP}/V_{DD}$ linearly varies from 0 to 1, $V_{Cxn}/V_{DD}$ will linearly vary from 1 to 0. Further, current $I_T$ 321 into inverting amplifier 302 can then be determined by:

$$I_T = I_{PD}/[1+(R_T/R_R)] \quad [\text{EQ. 4}]$$

where, $$R_T \approx R_F/G_{IA},$$

$R_F$=value of feedback resistor $R_F$ 306, and
$G_{IA}$=gain of inverting amplifier 302.

To determine the maximum number N of instances of replica gain control cell 331 required, an estimate of the maximum expected value of current $I_{PD}$ 320 or $I_{PDmax}$ is needed. With $I_{PDmax}$ known, the maximum number N of instances of replica gain control cell 331 can be determined by:

$$N = (R_{CELL}/R_T) * [(I_{PDmax}/I_T)-1]. \quad [\text{EQ. 5}]$$

The required number of instances n of replica gain control cell 331 to be enabled for an instance of $I_{PD}$ 320 that is less than $I_{PDmax}$ can further be determined by:

$$n = (R_{CELL}/R_T) * [(I_{PD}/I_T)-1] \quad [\text{EQ. 6}]$$

where, $$I_T \leq I_{PD} \leq I_{PDmax}.$$

A simplified expression of the bandwidth BW of the implementation shown in diagram 3B00 can be:

$$BW \approx 1/[\alpha_i * R_T * C_P + (1-\alpha_i) * R_{CELL} * C_{CELL}] \quad \text{[EQ. 6]}$$

where, $\alpha_i = I_T/I_{PD}$, $C_P$=the parasitic capacitance at node 325, and
$C_{CELL}$=the parasitic capacitance of replica gain control cell 331.

In some embodiments, current $I_T$ 321 can be required to be controlled (e.g., fixed) such that voltage $V_{OUT}$ 315 is subsequently controlled (e.g., fixed) as current $I_{PD}$ 320 varies. Thus, according to the aforementioned bandwidth equation, as current $I_{PD}$ 320 increases, the pole $R_T * C_P$ associated with inverting amplifier 302 and other fixed parasitic capacitances also increases as the total impedance at node 325 decreases (e.g., to maintain a constant current $I_T$ 321). In contrast, as current $I_{PD}$ 320 increases, the pole $R_{CELL} * C_{CELL}$ associated with replica gain control module 330 decreases. In some embodiments, the poles $R_T * C_P$ and $R_{CELL} * C_{CELL}$ can be of substantially the same magnitude such that there is a net increase in the bandwidth BW as current $I_{PD}$ 320 increases and more instances of replica gain control cell 331 are enabled (e.g., n is increased).

Figure 4:
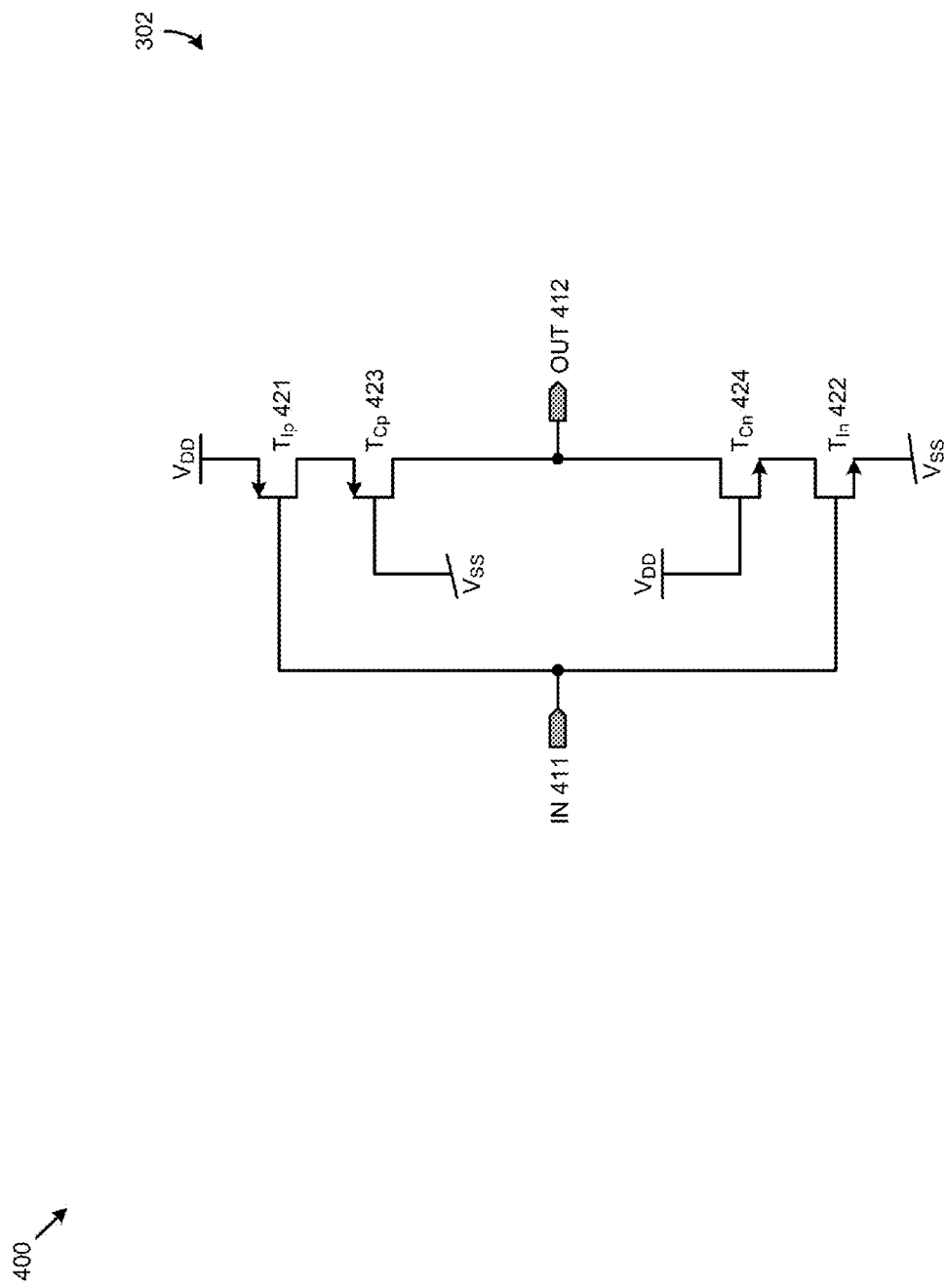
FIG. 4 presents a transistor-level schematic of an inverting amplifier as used to implement various trans-impedance amplifiers with replica gain control, according to some embodiments.

FIG. 4 presents a transistor-level schematic 400 of an inverting amplifier as used to implement various trans-impedance amplifiers with replica gain control. As an option, one or more instances of transistor-level schematic 400 or any aspect thereof may be implemented in the context of the architecture and functionality of the embodiments described herein. Also, transistor-level schematic 400 or any aspect thereof may be implemented in any desired environment.

As shown in FIG. 4, transistor-level schematic 400 shows the devices and connections comprising inverting amplifier 302 of diagram 3B00, according to some embodiments. Specifically, transistor-level schematic 400 shows that inverting amplifier 302 comprises transistor $T_{Ip}$ 421, transistor $T_{In}$ 422, transistor $T_{Cp}$ 423, and transistor $T_{Cn}$ 424. Transistor $T_{Ip}$ 421, transistor $T_{In}$ 422, transistor $T_{Cp}$ 423, and transistor $T_{Cn}$ 424 are arranged in a cascade configuration to achieve high gain and reduce the parasitic Miller capacitance of transistor $T_{Ip}$ 421 and transistor $T_{In}$ 422. The parasitic Miller capacitance of transistor $T_{Ip}$ 421 and transistor $T_{In}$ 422 is present at an input IN 411 of inverting amplifier 302 and contributes to the parasitic capacitance $C_P$ at node 325 (e.g., see diagram 3B00). In some embodiments, the parasitic Miller capacitance of transistor $T_{Ip}$ 421 and transistor $T_{In}$ 422 can impact the main pole $R_T * C_P$ of the trans-impedance amplifier with replica gain control.

Figure 5:
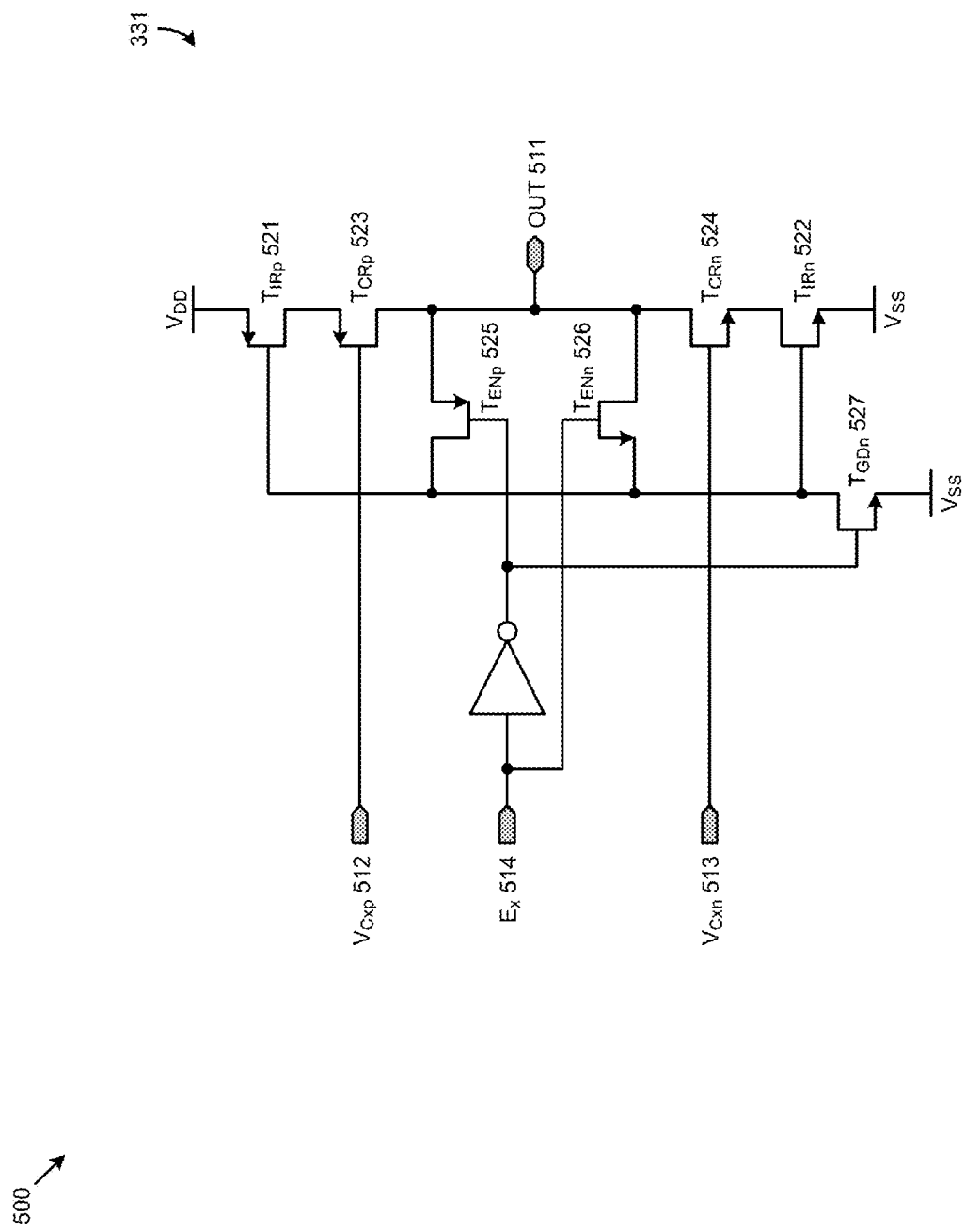
FIG. 5 presents a transistor-level schematic of a replica gain control cell as used to implement various trans-impedance amplifiers with replica gain control, according to some embodiments.

FIG. 5 presents a transistor-level schematic 500 of a replica gain control cell as used to implement various trans-impedance amplifiers with replica gain control. As an option, one or more instances of transistor-level schematic 500 or any aspect thereof may be implemented in the context of the architecture and functionality of the embodiments described herein. Also, transistor-level schematic 500 or any aspect thereof may be implemented in any desired environment.

As shown in FIG. 5, transistor-level schematic 500 shows the devices and connections comprising replica gain control cell 331 of diagram 3B00, according to some embodiments. Specifically, transistor level schematic 500 shows that replica gain control cell 331 comprises transistor $T_{IRp}$ 521, transistor $T_{IRn}$ 522, transistor $T_{CRp}$ 523, transistor $T_{CRn}$ 524, transistor $T_{ENp}$ 525, transistor $T_{ENn}$ 526, and transistor $T_{GDn}$ 527. When replica gain control cell 331 is enabled (e.g., high digital signal at an enable input $E_x$ 514), transistor $T_{ENp}$ 525 and transistor $T_{ENn}$ 526 are "on" (e.g., operate as pass gates or closed switches) and replica gain control cell 331 is configured as a cascoded inverter with its output (e.g., OUT 511) tied to its input (e.g., the gates of transistor $T_{IRp}$ 521 and transistor $T_{IRn}$ 522). A control voltage $V_{Cxp}$ 512 and a control voltage $V_{Cxn}$ 513 (e.g., the complement of control voltage $V_{Cxp}$ 512) can then be used to adjust $g_{mCELL}$ and the impedance $R_{CELL}$ of replica gain control cell 331 and in turn the overall impedance $R_R$ of replica gain control module 330. When replica gain control cell 331 is disabled (e.g., low digital signal at enable input $E_x$ 514), transistor $T_{ENp}$ 525 and transistor $T_{ENn}$ 526 are "off" (e.g., operate as open switches) and the gates of transistor $T_{IRp}$ 521 and transistor $T_{IRn}$ 522 are grounded through transistor $T_{DGn}$ 527. In the disabled state, output OUT 511, which is connected to node 325 (e.g., see diagram 3B00), will have a tri-state or high impedance characteristic. In some embodiments, when replica gain control cell 331 is disabled, control voltage $V_{Cxp}$ 512 and control voltage $V_{Cxn}$ 513 are set to $V_{DD}$ and $V_{SS}$, respectively.

One advantage exhibited by the implementation of replica gain control cell 331 shown in transistor-level schematic 500 is enabled by transistor $T_{ENp}$ 525 and transistor $T_{ENa}$ 526 (e.g., as pass gates or switches). Specifically, transistor $T_{ENp}$ 525 and transistor $T_{ENn}$ 526 enable a tri-state characteristics at output OUT 511 without requiring the gates of transistor $T_{IRp}$ 521 and transistor $T_{IRn}$ 522 to be disconnected from output OUT 511 when control voltage $V_{Cxp}$ 512 and control voltage $V_{Cxn}$ 513 are set to $V_{DD}$ and $V_{SS}$, respectively. Otherwise, the gate capacitance of transistor $T_{IRp}$ 521 and transistor $T_{IRn}$ 522 connected to output OUT 511 in tri-state would adversely impact the TIA bandwidth. As each instance of replica gain control cell 331 is enabled, the impedance at node 325 (e.g., see diagram 3B00) decreases while the parasitic capacitance from the newly enabled instance of replica gain control cell 331 adds to the parasitic capacitance already on node 325, maintaining or improving the bandwidth, in some embodiments. When all instances of replica gain control cell 331 are enabled, the maximum bandwidth of the TIA with replica gain control implementation can be determined. When no instances of replica gain control cell 331 are enabled, the maximum sensitivity of the TIA with replica gain control implementation can be determined.

Figure 6:
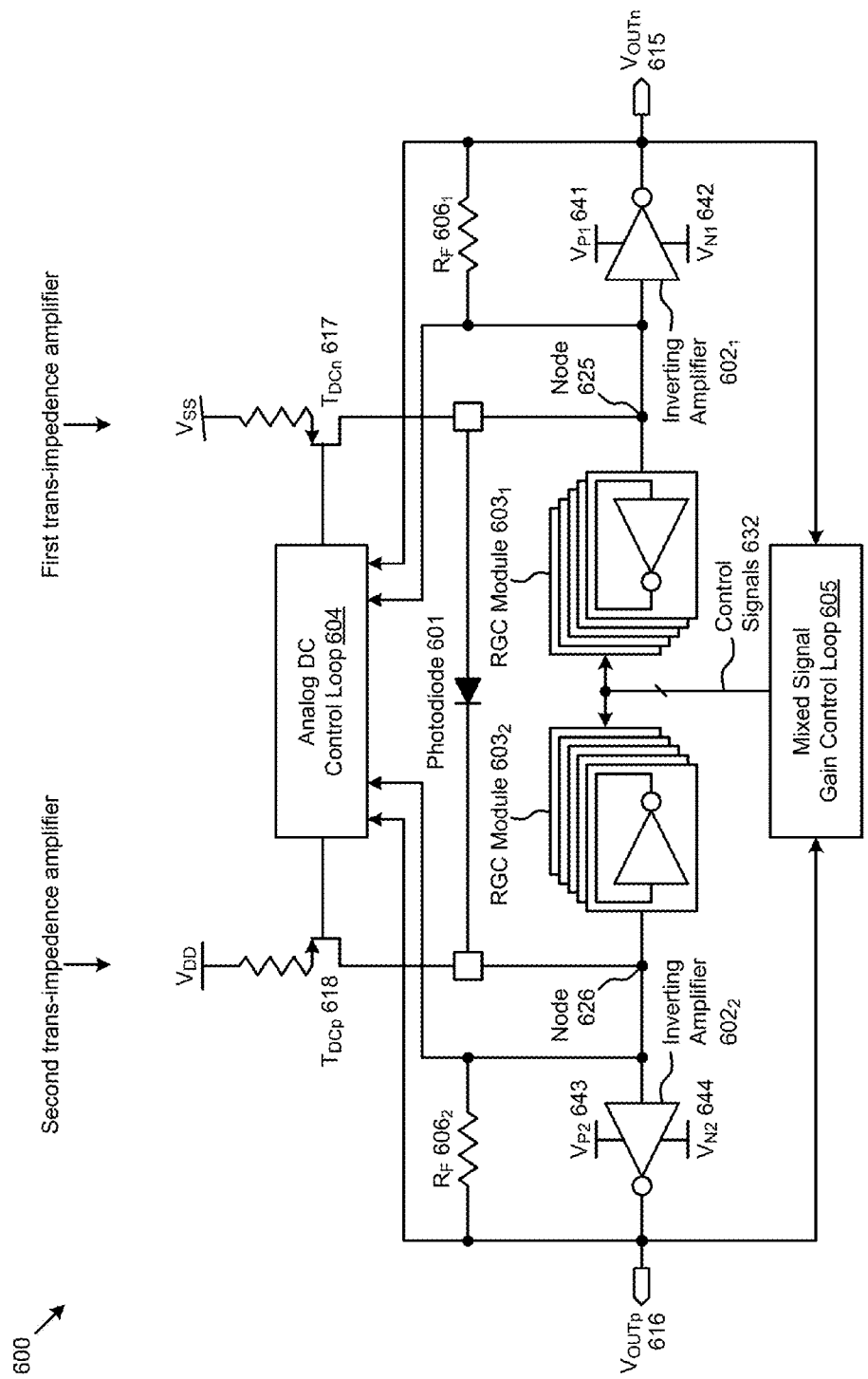
FIG. 6 is a schematic of a full differential trans-impedance amplifier with replica gain control, according to some embodiments.

FIG. 6 is a schematic 600 of a full differential trans-impedance amplifier with replica gain control. As an option, one or more instances of schematic 600 or any aspect thereof may be implemented in the context of the architecture and functionality of the embodiments described herein. Also, schematic 600 or any aspect thereof may be implemented in any desired environment.

As shown in FIG. 6, schematic 600 comprises a photodiode 601, a first inverting amplifier $602_1$, a second inverting amplifier $602_2$, a first replica gain control or RGC module $603_1$, a second RGC module $603_2$, an analog DC control loop 604, and a mixed signal gain control loop 605. A first feedback resistor $R_F$ $606_1$ is connected between the input and output of first inverting amplifier $602_1$, and a second feedback resistor $R_F$ $606_2$ is connected between the input and output of second inverting amplifier $602_2$. In some embodiments, as shown in schematic 600, first inverting amplifier $602_1$ and second inverting amplifier $602_2$ can be powered by different supply voltages to effect the required DC bias voltage across photodiode 601. For example, first inverting amplifier $602_1$ can be powered by a positive supply voltage $V_{P1}$ 641 of 1.0V and a negative supply voltage $V_{N1}$ 642 of 0.0V, providing a DC bias voltage at a node 625 of approximately 0.5V. Similarly, for example, second inverting amplifier $602_2$ can be powered by a positive supply voltage $V_{P2}$ 643 of 2.8V and a negative supply voltage $V_{N2}$ 644 of 1.8V, providing a DC bias voltage at a node 626 of approximately 2.3V. In some embodiments, the DC current through photodiode 601 can be offset by the current flowing through a transistor $T_{DCn}$ 617 and the current flowing through a transistor $T_{DCp}$ 618, wherein the currents flowing through transistor $T_{DCn}$ 617 and transistor $T_{DCp}$ 618 are controlled by analog DC control loop 604. A differential output voltage $V_{OUT}$ determined by the difference in voltage between a first voltage $V_{OUTp}$ 616 and a second voltage $V_{OUTn}$ 615 can be controlled (e.g., held constant) by mixed signal gain control loop 605. Mixed signal gain control loop 605 can control $V_{OUT}$, in part, by controlling (e.g., enabling, disabling, tuning, etc.) the plurality of replica gain control cells within first RGC module $603_1$ and second RGC module $603_2$ using a set of control signals 632, which effects the impedance of the plurality of RGC modules 603 and the analog tuning voltages at first node 625 and second node 626. The impedance of the plurality of RGC modules 603 can be controlled continuously over the whole range of currents through photodiode 601 in order to maintain a constant voltage $V_{OUT}$. In some embodiments, an implementation of mixed signal gain control loop 605 having certain characteristics is required to discretely enable the plurality of replica gain control cells within the plurality of RGC modules 603. More details regarding mixed signal gain control loop 605 are disclosed in FIG. 7A and the associated disclosure.

Figure 7A:
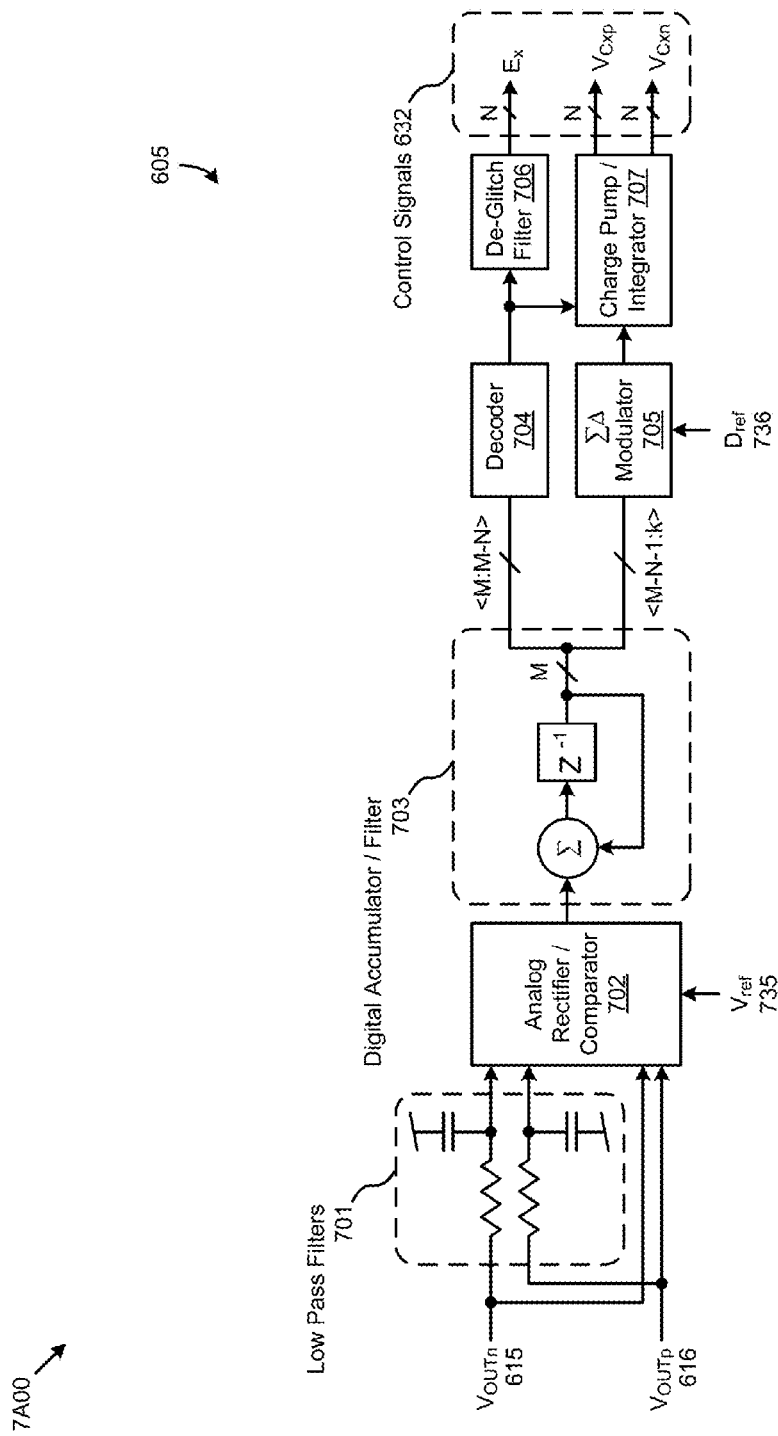
FIG. 7A is a functional diagram of a gain control loop as used to implement various trans-impedance amplifiers with replica gain control, according to some embodiments.

FIG. 7A is a functional diagram 7A00 of a gain control loop as used to implement various trans-impedance amplifiers with replica gain control. As an option, one or more instances of functional diagram 7A00 or any aspect thereof may be implemented in the context of the architecture and functionality of the embodiments described herein. Also, functional diagram 7A00 or any aspect thereof may be implemented in any desired environment.

As shown in FIG. 7A, functional diagram 7A00 shows the components and connections comprising mixed signal gain control loop 605 included in schematic 600, according to some embodiments. Specifically, functional diagram 7A00 shows that mixed signal gain control loop 605 comprises a set of low pass filters 701, an analog rectifier and comparator 702, a digital accumulator and filter 703, a decoder 704, a sigma-delta modulator 705, a low pass de-glitch filter 706, and an analog charge pump with differential integrator 707. Mixed signal gain control loop 605 receives a voltage $V_{OUT}$ (e.g., the difference between first voltage $V_{OUTp}$ 616 and second voltage $V_{OUTn}$ 615) from the circuit shown in schematic 600 and produces control signals 632 to drive the plurality of RGC modules 603. More specifically, analog rectifier and comparator 702 receives the AC voltage $V_{OUT}$ and a filtered (e.g., by low pass filters 701) DC voltage $V_{OUT-DC}$, wherein the filtered DC voltage $V_{OUT-DC}$ serves as a trip point or threshold by which the AC voltage $V_{OUT}$ can be rectified. The rectified voltage signal is then compared by analog rectifier and comparator 702 to a reference voltage $V_{ref}$ 735 (e.g., representing the desired $V_{OUT}$ voltage level), producing a binary output indicating whether the rectified voltage signal is greater than or less than reference voltage $V_{ref}$ 735. In some embodiments, the operation of mixed signal gain control loop 605 from the output of analog rectifier and comparator 702 can be characterized as providing heavily averaged negative feedback. Specifically, the output of analog rectifier and comparator 702 is received by digital accumulator and filter 703 and translated into an averaged or filtered digital representation (e.g., M bits wide) of the difference between $V_{OUT}$ and reference voltage $V_{ref}$ 735. A set of the most significant bits <M:M-N> (e.g., M=20, N=11) from digital accumulator and filter 703 are directly decoded by decoder 704 and filtered by low pass de-glitch filter 706 to provide a set (e.g., N=11 signals) of enable inputs $E_x$ included in control signals 632. A set of the least significant bits <M-N-1:k> (e.g., M=20, N=11, k=0) are converted to analog by sigma-delta modulator 705 and analog charge pump with differential integrator 707 to provide a set (e.g., N=11 signals, each) of differential analog control or tuning voltages, $V_{Cxp}$ and $V_{Cxn}$, included in control signals 632. In some embodiments, charge pump with differential integrator 707 converts the digital output of sigma-delta modulator 705 to a precision analog voltage (e.g., $V_{Cxn}$) and generates the complement (e.g., $V_{Cxp}$).

Figure 7B:
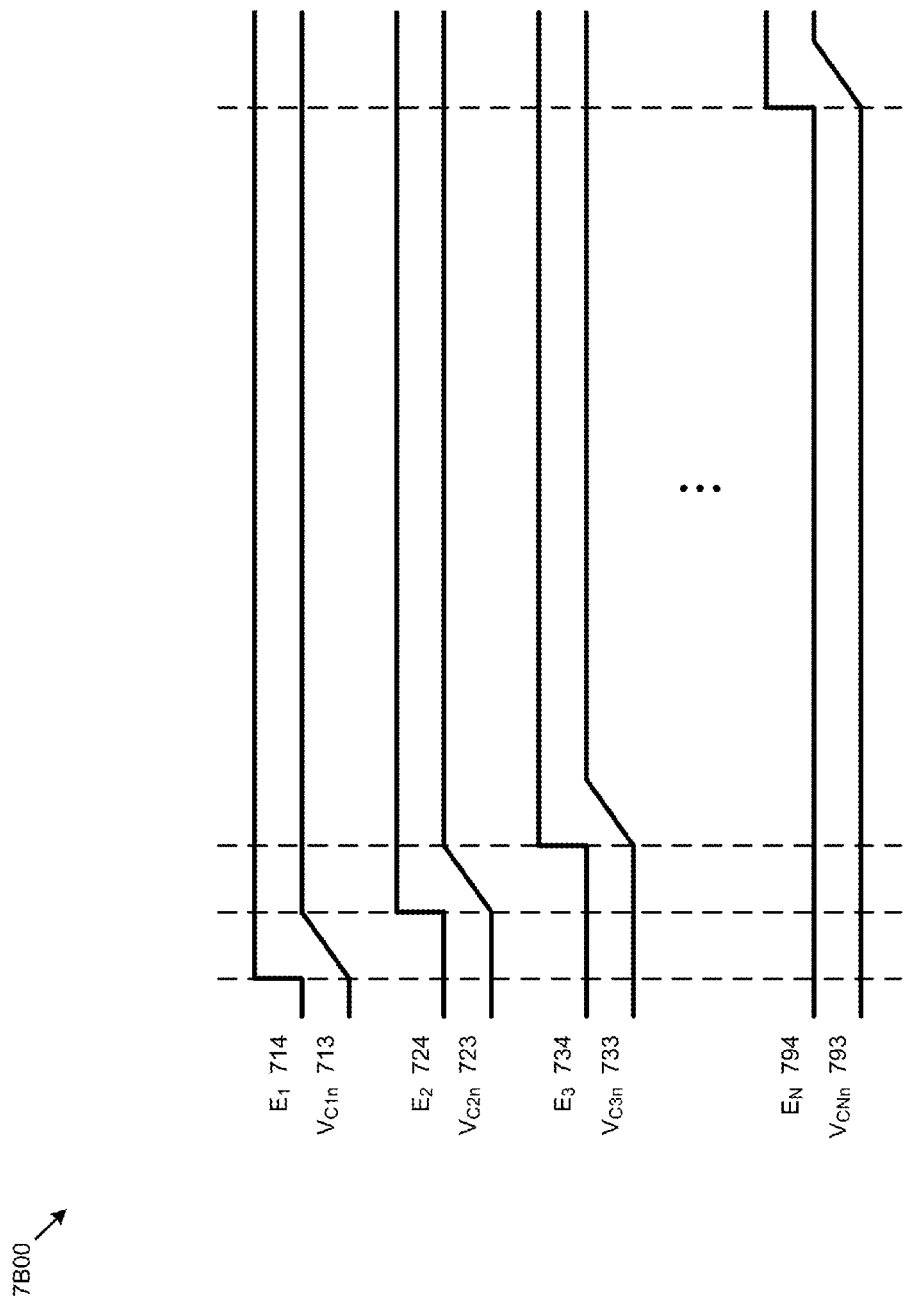
FIG. 7B exemplifies selected instances of output waveforms of a gain control loop used to implement various trans-impedance amplifiers with replica gain control, according to some embodiments.

FIG. 7B exemplifies selected instances of output waveforms 7B00 of a gain control loop used to implement various trans-impedance amplifiers with replica gain control. As an option, one or more instances of output waveforms 7B00 or any aspect thereof may be implemented in the context of the architecture and functionality of the embodiments described herein. Also, output waveforms 7B00 or any aspect thereof may be implemented in any desired environment.

As shown in FIG. 7B, output waveforms 7B00 comprises temporal representations of the voltage levels of select signals from control signals 632 as shown in schematic 600 and functional diagram 7A00. Specifically shown in output waveforms 7B00 are an enable signal $E_1$ 714, an enable signal $E_2$ 724, an enable signal $E_3$ 734, and an enable signal $E_N$ 794. Further shown in output waveforms 7B00 are a control signal $V_{C1n}$ 713, a control signal $V_{C2n}$ 723, a control signal $V_{C3n}$ 733, and a control signal $V_{CNn}$ 793. In order to create a smooth or piece-wise linear change in the impedance of the plurality of RGC modules 603 (e.g., see schematic 600), each replica gain control cell included in the plurality of RGC modules 603 can be controlled and sequenced as shown in output waveforms 7B00. Specifically, in one embodiment and example, as each replica gain control cell is enabled (e.g., cell 1 is enabled by $E_1$ 714 going from low to high) in sequence, as illustrated in output waveforms 7B00, the resistance at node 625 and node 626 (e.g., see schematic 600) decreases and shunts more of the current through photodiode 601 into RGC module $603_1$ and RGC module $603_2$, respectively, and shunts less of the current through photodiode 601 into inverting amplifier $602_1$ and inverting amplifier $602_2$, respectively, thereby reducing the output voltage $V_{OUT}$. As shown in output waveforms 7B00, when each replica gain control cell is first enabled (e.g., $E_x$ goes from low to high), the cell control voltage $V_{Cxn}$ can be equal to or near $V_{SS}$, and its complement $V_{Cxp}$ (not shown) can be equal to or near $V_{DD}$. The response from mixed signal control loop 605 can then increase (e.g., ramp) control voltage $V_{Cxn}$ until it is equal to or near $V_{DD}$, and decrease its complement $V_{Cxp}$ (not shown) until it is equal to or near $V_{SS}$. If the output voltage $V_{OUT}$ remains higher than desired (e.g., relative to $V_{ref}$ 735), another replica gain control cell can be enabled, while other currently enabled cells remain enabled, each with their control voltage $V_{Cxn}$ remaining at or near $V_{DD}$, and each with their complement $V_{Cxp}$ (not shown) remaining at or near $V_{SS}$. If the output voltage $V_{OUT}$ is lower than desired (e.g., relative to $V_{ref}$ 735), the process is reversed and one or more replica gain control cells can be disabled in sequence. Through this process of enabling and disabling replica gain control cells controlled by mixed signal control loop 605, the desired output voltage $V_{OUT}$ can be achieved.

Figure 8A:
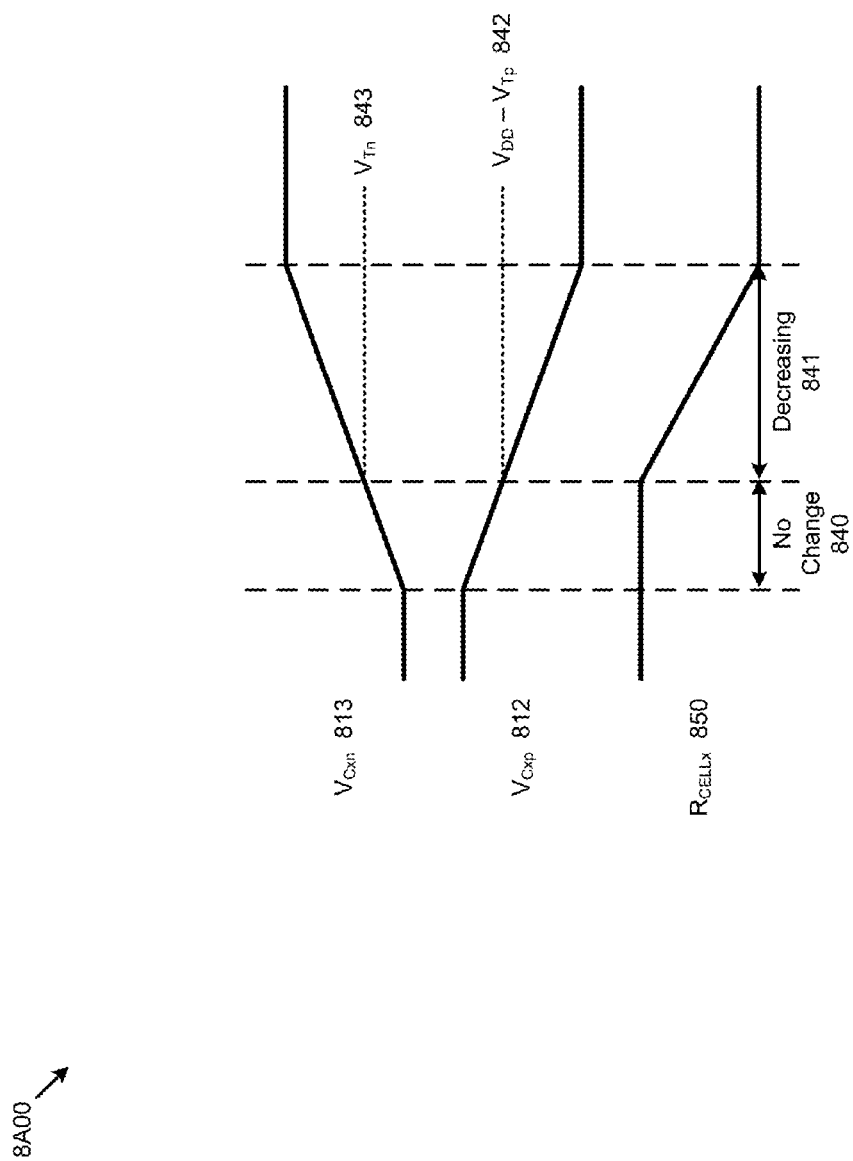
FIG. 8A depicts the cell-level voltage inputs of a replica gain control cell as used to implement various trans-impedance amplifiers with replica gain control, according to some embodiments.

FIG. 8A depicts a cell-level impedance characteristics diagram 8A00 of a replica gain control cell as used to implement various trans-impedance amplifiers with replica gain control. As an option, one or more instances of cell-level impedance characteristics diagram 8A00 or any aspect thereof may be implemented in the context of the architecture and functionality of the embodiments described herein. Also, cell-level impedance characteristics diagram 8A00 or any aspect thereof may be implemented in any desired environment.

As shown in FIG. 8A, cell-level impedance characteristics diagram 8A00 comprises temporal representations of the voltage levels of the control signals of a given replica gain control cell and of the corresponding cell impedance response. Specifically shown in cell-level impedance characteristics diagram 8A00 are a control signal $V_{Cxn}$ 813, a control signal $V_{Cxp}$ 812, and a cell impedance $R_{CELLx}$ 850. When a given replica gain control cell (e.g., cell "x" included in the plurality of RGC modules 603) is enabled by mixed signal gain control loop 605, mixed signal gain control loop 605 will begin to drive changes to control signal $V_{Cxn}$ 813 and control signal $V_{Cxp}$ 812 of the given replica gain control cell, to which impedance $R_{CELLx}$ 850 will respond. Specifically, as shown in cell-level impedance characteristics diagram 8A00, as control signal $V_{Cxn}$ 813 increases and control signal $V_{Cxp}$ 812 decreases, impedance $R_{CELLx}$ 850 will initially show no response during a no change period 840. When the voltage of control signal $V_{Cxn}$ 813 has exceeded a threshold voltage $V_{Tn}$ 843 (e.g., determined, in part, by transistor $T_{IRn}$ 522 and transistor $T_{CRn}$ 524 in transistor-level schematic 500) and the voltage of control signal $V_{Cxp}$ 812 has dropped below a threshold voltage $V_{DD}$-$V_{Tp}$ 842 (e.g., determined, in part, by transistor $T_{IRp}$ 521 and transistor $T_{CRp}$ 523 in transistor-level schematic 500), impedance $R_{CELLx}$ 850 will enter a decreasing period 841 in which impedance $R_{CELLx}$ 850 will decrease in response to the changes in control signal $V_{Cxm}$ 813 and control signal $V_{Cxp}$ 812. When control signal $V_{Cxn}$ 813 and control signal $V_{Cxp}$ 812 have reached their upper (e.g., $V_{DD}$) and lower (e.g., $V_{SS}$) limits, respectively, impedance $R_{CELLx}$ 850 will remain at its minimum value.

Figure 8B:
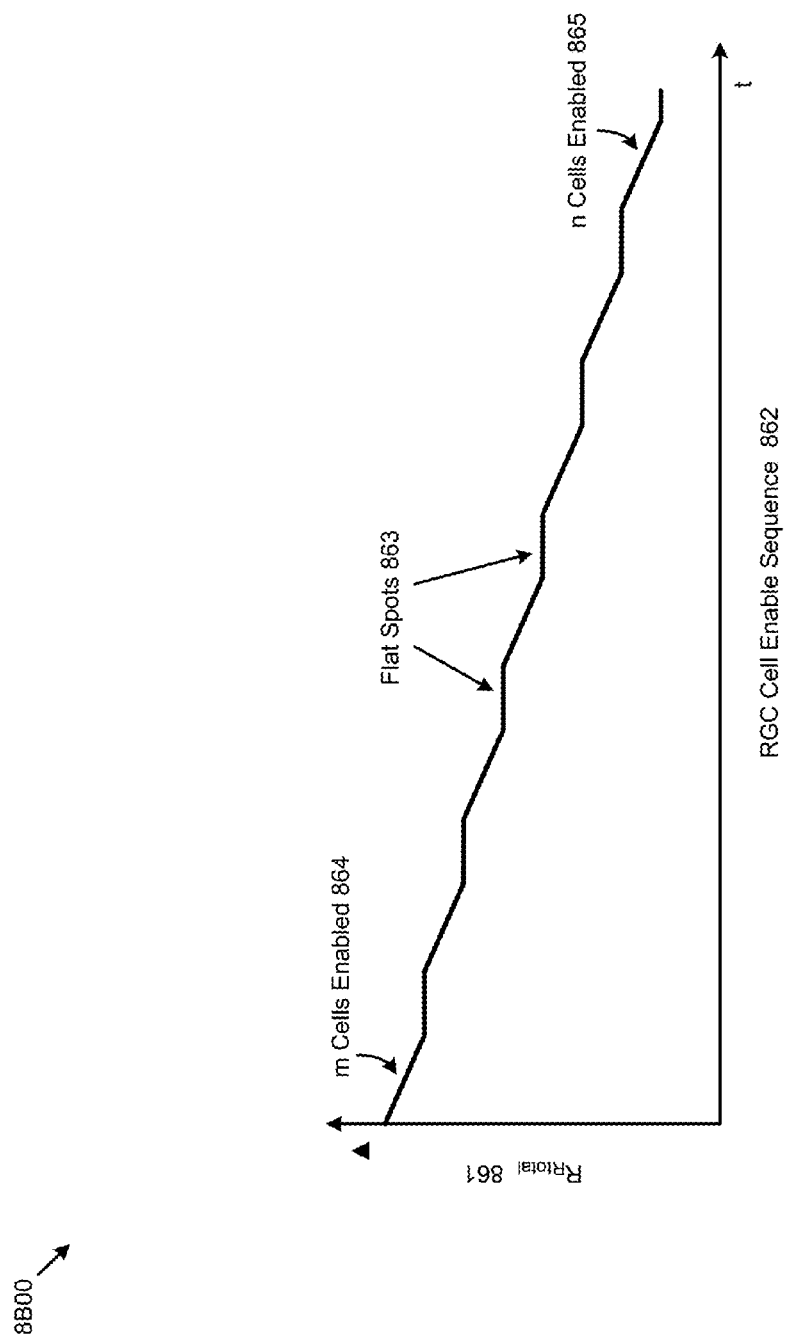
FIG. 8B depicts a module-level input impedance characteristics diagram of a replica gain control module as used to implement various trans-impedance amplifiers with replica gain control, according to some embodiments.

FIG. 8B depicts a module-level impedance characteristics diagram 8B00 of a replica gain control module as used to implement various trans-impedance amplifiers with replica gain control. As an option, one or more instances of module-level impedance characteristics diagram 8B00 or any aspect thereof may be implemented in the context of the architecture and functionality of the embodiments described herein. Also, module-level impedance characteristics diagram 8B00 or any aspect thereof may be implemented in any desired environment.

As shown in FIG. 8B, module-level impedance characteristics diagram 8B00 illustrates the behavior of a total impedance $R_{Rtota}$ 861 of a given RGC module (e.g., RGC module $603_1$ in schematic 600) as the RGC cells within the given RGC module are enabled in an RGC cell enable sequence 862 (e.g., by mixed signal gain control loop 605 in schematic 600). In some embodiments, no change period 840 for each RGC cell (e.g., see FIG. 8A) will result in a set of "flat spots" 863 in the overall transfer function of total impedance $R_{Rtotal}$ 861 as the number of cells enabled traverses from a state with m cells enabled 864 to a state with n cells enabled 865. In some embodiments, flat spots 863 can be reduced by starting the voltage ramps of control signal $V_{Cxn}$ 813 and control signal $V_{Cxp}$ 812 at voltages closer to threshold voltage $V_{Tn}$ 843 and threshold voltage $V_{DD}$-$V_{Tp}$ 842, respectively (e.g., see FIG. 8A). In some embodiments, mixed signal gain control loop 605, as described in functional diagram 7A00, will operate properly when the transfer function shown in module-level impedance characteristics diagram 8B00 is monotonic. For example, when a given RGC cell is enabled it can add a small additional parasitic capacitance to a terminal (e.g., node 625) of photodiode 601 which can reduce the amplitude of the AC signal at $V_{OUT}$. This effect can provide the required monotonicity with an acceptably small reduction in resolution.

Figure 9:
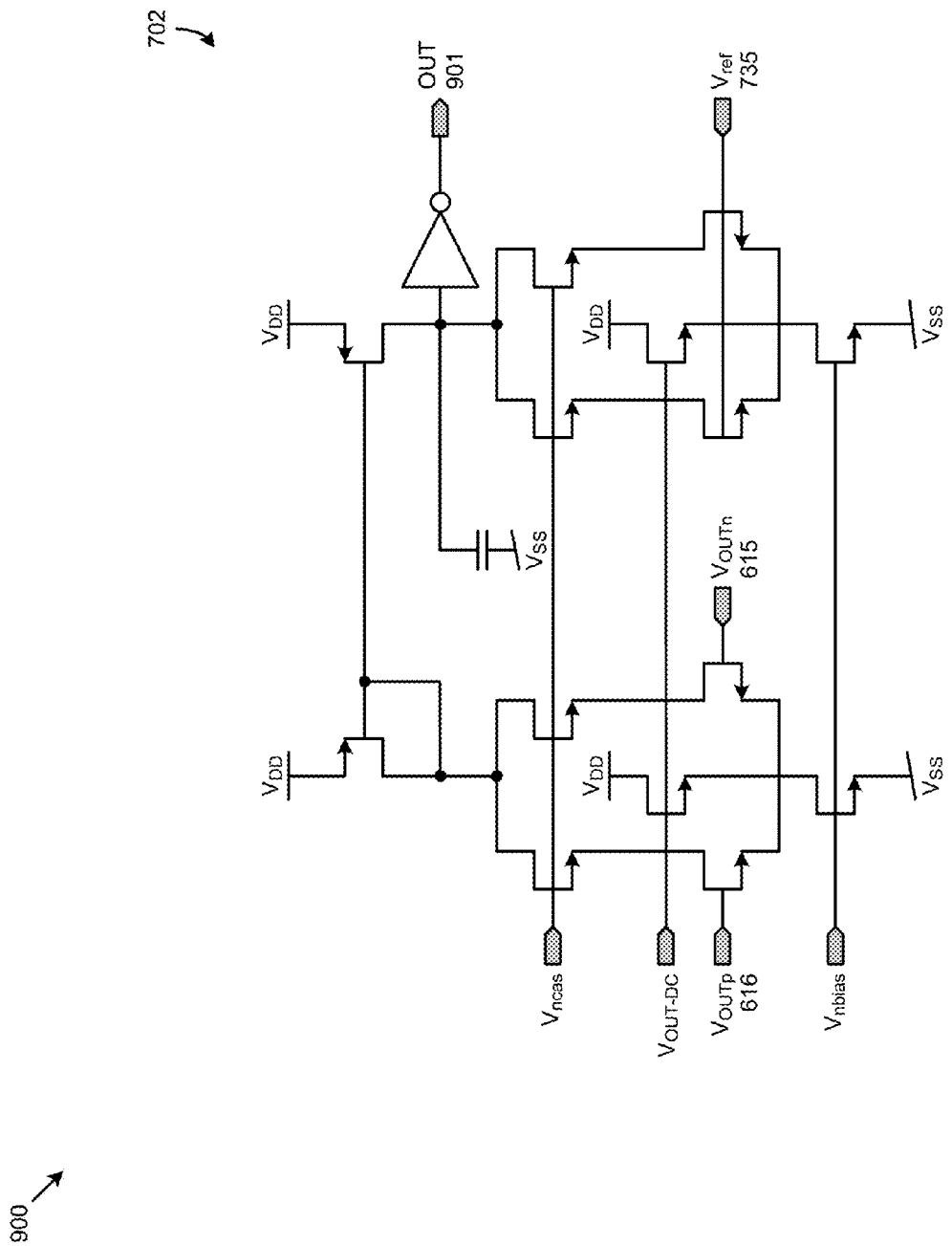
FIG. 9 is a transistor-level schematic of a gain control loop rectifier and comparator as used to implement various trans-impedance amplifiers with replica gain control, according to some embodiments.

FIG. 9 is a transistor-level schematic 900 of a gain control loop rectifier and comparator as used to implement various trans-impedance amplifiers with replica gain control. As an option, one or more instances of transistor-level schematic 900 or any aspect thereof may be implemented in the context of the architecture and functionality of the embodiments described herein. Also, transistor-level schematic 900 or any aspect thereof may be implemented in any desired environment.

As shown in FIG. 9, transistor-level schematic 900 shows the devices and connections comprising analog rectifier and comparator 702 of functional diagram 7A00, according to some embodiments. Specifically, transistor-level schematic 900 shows the connection points of first voltage $V_{OUTp}$ 616, second voltage $V_{OUTn}$ 615, the filtered DC voltage $V_{OUT-DC}$, and reference voltage $V_{ref}$ 735, presented in functional diagram 7A00 of FIG. 7A and the associated disclosure. Analog rectifier and comparator 702 compares the average full-wave rectified differential voltage $V_{OUT}$ (e.g., the difference between first voltage $V_{OUTp}$ 616 and second voltage $V_{OUTn}$ 615) to reference voltage $V_{ref}$ 735 to produce a digital output signal OUT 901. Digital output signal OUT 901 provides the input to digital accumulator and filter 703 of functional diagram 7A00.

Finally, it should be noted that there are alternative ways of implementing the embodiments disclosed herein. Accordingly, the present embodiments are to be considered as illustrative and not restrictive, and the claims are not to be limited to the details given herein, but may be modified within the scope and equivalents thereof.

In the foregoing specification, the disclosure has been described with reference to specific embodiments thereof. It will, however, be evident that various modifications and changes may be made thereto without departing from the broader spirit and scope of the disclosure. The specification and drawings are, accordingly, to be regarded in an illustrative sense rather than in a restrictive sense.

What is claimed is:

1. A trans-impedance amplifier for amplifying an input signal, the trans-impedance amplifier comprising:
   a first common node to receive a first current input of the input signal;
   a first inverting amplifier having a first amplifier input coupled to the first common node, and having a first voltage output;
   a first replica gain control module comprising a first module input coupled to the first common node, and at least one replica gain control cell coupled to the first module input,
   wherein the first replica gain control module diverts a first portion of the first current input away from the first inverting amplifier to effect the first voltage output;
   a second common node to receive a second current input of the input signal; and
   a second replica gain control module having a second module input coupled to the second common node to receive a second portion of the second current input.

2. The trans-impedance amplifier of claim 1, wherein at least one replica gain control cell further comprises at least one control input to control a magnitude of the first portion of the first current input.

3. The trans-impedance amplifier of claim 2, wherein at least one replica gain control cell further comprises at least one pass gate device coupled to the first module input and coupled to at least one control input.

4. The trans-impedance amplifier of claim 2, further comprising a gain control loop coupled to the first voltage output and at least one control input.

5. The trans-impedance amplifier of claim 4, wherein the gain control loop provides a discrete control signal coupled to at least one control input.

6. The trans-impedance amplifier of claim 4, wherein the gain control loop provides a linear control signal coupled to at least one control input.

7. The trans-impedance amplifier of claim 4, wherein the gain control loop uses analog or digital circuits to change a number of replica gain control cells enabled.

8. The trans-impedance amplifier of claim 4, further comprising analog or digital circuits to control tuning voltages to change at least one replica gain control impedance.

9. The trans-impedance amplifier of claim 1, further comprising:
a second inverting amplifier having a second amplifier input coupled to the second common node, and having a second voltage output
wherein the second replica gain control module diverts the second portion of the second current input away from the second inverting amplifier to effect the second voltage output, and wherein a voltage difference between the first voltage output and the second voltage output comprise a differential voltage output.

10. The trans-impedance amplifier of claim 9, wherein the second replica gain control module further comprises at least one control input to control a magnitude of the second portion of the second current input.

11. The trans-impedance amplifier of claim 9, wherein the second replica gain control module further comprises at least one pass gate device.

12. The trans-impedance amplifier of claim 9, further comprising a gain control loop coupled to the first voltage output and at least one control input.

13. The trans-impedance amplifier of claim 12, wherein the gain control loop provides a discrete control signal.

14. The trans-impedance amplifier of claim 12, wherein the gain control loop provides a linear control signal coupled to at least one control input.

15. A system for amplifying an input signal, the system comprising:
a first common node to receive a first current input of the input signal;
a first inverting amplifier having a first amplifier input coupled to the first common node, and having a first voltage output;
a first replica gain control module comprising a first module input coupled to the first common node, and at least one replica gain control cell coupled to the first module input,
wherein the first replica gain control module diverts a first portion of the first current input away from the first inverting amplifier to effect the first voltage output;
a second common node to receive a second current input of the input signal;
a second replica gain control module having a second module input coupled to the second common node to receive a second portion of the second current input; and
a gain control loop to control a magnitude of at least one of, the first portion of the first current input, or the second portion of the second current input.

16. The system of claim 15, further comprising an analog control loop having a first analog voltage tuning signal.

17. The system of claim 16, wherein the first analog tuning voltage signal changes an impedance of at least one replica gain control module.

18. The system of claim 16, wherein the first analog voltage tuning signal derives from a digital-to-analog converter (DAC).

19. The system of claim 15, further comprising an analog control loop having a second analog voltage tuning signal.

20. The system of claim 15, further comprising:
a second inverting amplifier having a second amplifier input coupled to the second common node and having a second voltage output,
wherein the second replica gain control module diverts a second portion of the second current input away from the second inverting amplifier to effect the second voltage output, and wherein a voltage difference between the first voltage output and the second voltage output comprise a differential voltage output.

* * * * *